United States Patent
Karmous

(10) Patent No.: US 9,722,059 B2
(45) Date of Patent: Aug. 1, 2017

(54) LATCH-UP FREE POWER TRANSISTOR

(71) Applicant: INFINEON TECHNOLOGIES AG, Neubiberg (DE)

(72) Inventor: Alim Karmous, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/832,959

(22) Filed: Aug. 21, 2015

(65) Prior Publication Data

US 2017/0054007 A1 Feb. 23, 2017

(51) Int. Cl.
| | |
|---|---|
| *H01L 29/739* | (2006.01) |
| *H01L 29/06* | (2006.01) |
| *H01L 29/10* | (2006.01) |
| *H01L 29/08* | (2006.01) |
| *H01L 29/66* | (2006.01) |
| *H01L 29/417* | (2006.01) |

(52) U.S. Cl.
CPC ...... *H01L 29/7395* (2013.01); *H01L 29/0696* (2013.01); *H01L 29/0804* (2013.01); *H01L 29/0821* (2013.01); *H01L 29/1095* (2013.01); *H01L 29/41708* (2013.01); *H01L 29/6634* (2013.01); *H01L 29/66295* (2013.01); *H01L 29/66303* (2013.01); *H01L 29/7393* (2013.01)

(58) Field of Classification Search
CPC ............ H01L 29/7393; H01L 29/0696; H01L 29/0804; H01L 29/1095; H01L 29/41708; H01L 29/66303; H01L 29/6634; H01L 29/7395; H01L 29/66295; H01L 29/0821
See application file for complete search history.

(56) References Cited

U.S. PATENT DOCUMENTS

| | | | |
|---|---|---|---|
| 4,983,535 A | 1/1991 | Blanchard | |
| 2008/0128760 A1* | 6/2008 | Jun | B82Y 10/00 257/280 |
| 2008/0128786 A1* | 6/2008 | Kim | B82Y 10/00 257/321 |
| 2008/0179666 A1* | 7/2008 | Foerster | H01L 29/1095 257/330 |
| 2009/0014788 A1* | 1/2009 | Okumura | H01L 29/1095 257/334 |
| 2010/0264546 A1* | 10/2010 | Torii | H01L 24/03 257/773 |
| 2011/0163366 A1* | 7/2011 | Zundel | H01L 21/743 257/301 |
| 2011/0165755 A1* | 7/2011 | Zundel | H01L 21/743 438/386 |
| 2015/0014743 A1* | 1/2015 | Werber | H01L 23/48 257/140 |

(Continued)

*Primary Examiner* — Joseph C Nicely
(74) *Attorney, Agent, or Firm* — Murphy, Bilak & Homiller, PLLC

(57) ABSTRACT

There are disclosed herein various implementations of a latch-up free power transistor. Such a device includes an insulated gate situated adjacent to a conduction channel in the power transistor, an emitter electrode in direct physical contact with the conduction channel, and a collector electrode in electrical contact with the conduction channel. The power transistor also includes an emitter layer in contact with a surface of a semiconductor substrate adjacent the conduction channel.

18 Claims, 9 Drawing Sheets

(56) References Cited

U.S. PATENT DOCUMENTS

| | | | |
|---|---|---|---|
| 2015/0021656 A1* | 1/2015 | Kitagawa | H01L 29/0834 257/139 |
| 2015/0035003 A1* | 2/2015 | Hu | H01L 29/66348 257/139 |
| 2015/0123148 A1* | 5/2015 | Nakano | H01L 29/7802 257/77 |
| 2015/0179637 A1* | 6/2015 | Pfirsch | H01L 27/0635 257/144 |
| 2015/0187922 A1* | 7/2015 | Song | H01L 29/42368 257/139 |
| 2015/0228538 A1* | 8/2015 | Wada | H01L 21/76879 257/774 |
| 2016/0149044 A1* | 5/2016 | Noda | H01L 29/78603 257/43 |
| 2016/0204099 A1* | 7/2016 | Kawai | H01L 27/0629 257/139 |
| 2016/0204236 A1* | 7/2016 | Torii | H01L 29/7397 257/139 |
| 2016/0204237 A1* | 7/2016 | Chen | H01L 29/7397 257/139 |
| 2016/0329323 A1* | 11/2016 | Iwasaki | H01L 27/0727 |

\* cited by examiner

US 9,722,059 B2

LATCH-UP FREE POWER TRANSISTOR

BACKGROUND

Power transistors, such as silicon based insulated-gate bipolar transistors (IGBTs) for example, may be used in a variety of applications. For instance, due to their comparatively large current and voltage handling capabilities, IGBTs may be used as power switches in motor drive inverters. Despite their advantages, however, IGBTs are susceptible to malfunction and failure as a result of latch-up. For example, a vertical IGBT structure utilizing an N type drift region typically includes a parasitic NPN bipolar junction transistor coupling the emitter to the collector. Latch-up of such an IGBT occurs when the parasitic transistor is inadvertently turned on, which prevents the insulated gate of the IGBT from being usable to control current through the IGBT or to turn the IGBT off. As a result, latch-up is a highly undesirable condition and can be destructive.

SUMMARY

The present disclosure is directed to a latch-up free power transistor, substantially as shown in and/or described in connection with at least one of the figures, and as set forth completely in the claims.

DETAILED DESCRIPTION

Figure 1A:
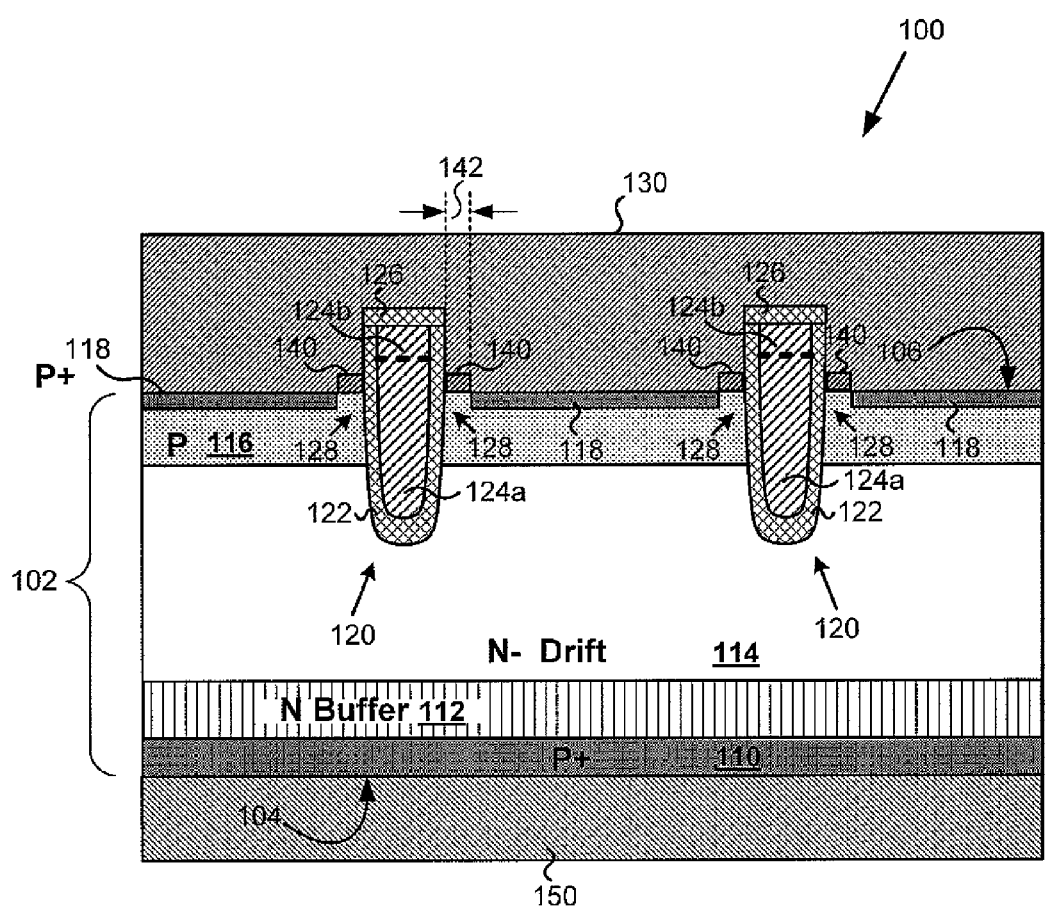
FIG. 1A presents a cross-sectional view showing a portion of an exemplary latch-up free power transistor in the form of an insulated-gate bipolar transistor (IGBT), according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, power transistors, such as silicon based insulated-gate bipolar transistors (IGBTs), may be used in a variety of applications. For example, due to their comparatively large current and voltage handling capabilities, IGBTs may be used as power switches in motor drive inverters. Despite their advantages, however, IGBTs are susceptible to malfunction and failure as a result of latch-up. For example, a vertical IGBT structure utilizing an N type drift region typically includes a parasitic NPN bipolar junction transistor coupling the emitter to the collector. Latch-up of such an IGBT occurs when the parasitic transistor is inadvertently turned on, which prevents the insulated gate of the IGBT from being usable to control current through the IGBT or to turn the IGBT off. As a result, latch-up is a highly undesirable condition and can be destructive.

The present application discloses implementations of a latch-up free power transistor. According to the exemplary implementations disclosed in the present application, a highly doped region utilized as a source or emitter diffusion in a conventional power transistor structure is omitted. In its place is substituted an emitter electrode or a portion of an emitter layer configured to make direct physical contact with a conduction channel of the power transistor. Consequently, the power transistor structures disclosed herein eliminate the parasitic bipolar junction transistors present in conventional IGBT structures, thereby advantageously preventing the occurrence of latch-up. For example, FIG. 1A shows a cross-sectional view of an exemplary latch-up free power transistor in the form of an IGBT, according to one implementation.

FIG. 1A presents a cross-sectional view showing a portion of power transistor 100 in semiconductor substrate 102. As shown in FIG. 1A, power transistor 100 is implemented as an IGBT including P type collector 110 at bottom surface 104 of semiconductor substrate 102, and N type drift region 114 situated over P type collector 110. In addition, P type body 116 is situated over N type drift region 114. As further shown in FIG. 1A, power transistor 100 also includes insulated gates 120 in the form of insulated gate trenches extending from surface 106 of semiconductor substrate 102 into N type drift region 114. Each of insulated gates 120 includes a respective gate insulator 122 and conductive gate electrode portions 124a and 124b.

Power transistor 100 further includes emitter layer 130 formed of a first metal, emitter electrodes 140 formed of a second metal and having width 142, and conduction channels 128 controlled by insulated gates 120. Conduction channels 128 provide a conductive path through P type body 116 in regions immediately adjacent insulated gates 120. Thus, when power transistor 100 is turned on, conduction channels 128 are produced as N type conductive paths through P type body 116 so as to electrically couple metal emitter electrode 140 to P type collector 110 via N type drift region 114. According to the implementation shown in FIG. 1A, conduction channels 128 are N type channels.

Also shown in FIG. 1A is collector electrode 150 adjoining P type collector 110 and consequently also in electrical contact with conduction channels 128. In addition, power transistor 100 includes optional N type buffer or field stop layer 112, highly conductive P type contact regions 118 of P type body 116, and dielectric layers 126.

It is noted that although the implementation shown in FIG. 1A depicts power transistor 100 as having P type collector 110, optional N type buffer layer 112, N type drift region 114, P type body 116, and as being configured to produce N type conduction channels 128, that representation is merely exemplary. In other implementations, the described polarities can be reversed such that power transistor 100 may have an N type collector, an optional P type buffer layer, a P type drift region, and an N type body, and may be configured to produce a P type conduction channel. It is further noted that although power transistor 100 is shown to have a vertical IGBT structure, in other implementations, the present inventive principles can be readily adapted for use in a lateral IGBT device.

Semiconductor substrate 102 may be a silicon (Si) substrate or a silicon carbide (SiC) substrate, for example. In some implementations, semiconductor substrate 102 may include N type drift region 114 and P type body 116 formed in an epitaxial silicon layer of semiconductor substrate 102. Formation of such an epitaxial silicon layer may be performed by any suitable method, as known in the art, such as chemical vapor deposition (CVD) or molecular beam epitaxy (MBE), for example. More generally, however, N type drift region 114 and P type body 116 may be formed in any suitable elemental or compound semiconductor layer included in semiconductor substrate 102.

Thus, in other implementations, N type drift region 114 and P type body 116 need not be formed through epitaxial growth, and/or need not be formed of silicon. For example, in one alternative implementation, N type drift region 114 and P type body 116 can be formed in a float zone silicon layer of semiconductor substrate 102. In other implementations, N type drift region 114 and P type body 116 can be formed in either a strained or unstrained germanium layer formed as part of semiconductor substrate 102. Moreover, in some implementations, semiconductor substrate 102 may include additional layers, such as N type buffer or field stop layer 112 situated between P type collector 110 and N type drift region 114, as shown in FIG. 1A.

P type body 116 may be formed by implantation and thermal diffusion. For example, boron (B) dopants may be implanted into semiconductor substrate 102 and diffused to form P type body 116. Moreover, highly conductive P type contact regions 118 of P type body 116 may be more highly doped regions of P type body 116 utilizing the same dopant species used to form P type body 116. It is noted that highly conductive P type contact regions 118 are spaced apart from insulated gates 120 by a distance at least as great as a width of conduction channels 128, e.g., a distance that may be less than or approximately equal to ten nanometers (10 nm).

Gate insulator 122 and dielectric layers 126 may be formed using any material and any technique typically employed in the art. For example, gate insulator 122 and dielectric layers 126 may be formed of silicon oxide, and may be deposited or thermally grown to produce gate insulator 122 and dielectric layers 126. Conductive gate electrode portions 124a and 124b may also be formed using any material typically utilized in the art. For example, conductive gate electrode portions 124a and 124b may be formed of doped polysilicon or metal. It is noted that although the electrical connection among the conductive gate electrodes of power transistor 100 is not explicitly shown in the cross-sectional perspective provided by FIG. 1A, conductive gate electrodes portions 124b can be shorted together in the third dimension relative to the cross-sectional plane of FIG. 1A.

As noted above, insulated gates 120 are situated adjacent conduction channels 128 in power transistor 100. Moreover, conduction channels 128 are in direct physical contact with emitter electrodes 140 at surface 106 of semiconductor substrate 102 and with collector electrode 150 at bottom surface 104 of semiconductor substrate 102. As further shown in FIG. 1A, emitter layer 130 is in direct physical contact with surface 106 of semiconductor substrate 102 adjacent conduction channels 128. Thus, according to the present implementation, emitter layer 130 adjoins and may make Schottky and/or ohmic contact with highly conductive P type contact regions 118 of body 116, while emitter electrodes 140 are in direct physical contact, i.e., Schottky and/or ohmic contact, with body 116 at conduction channels 128 from which highly conductive P type contact regions 118 are excluded.

It is noted that the respective metal/semiconductor interfaces between emitter layer 130 and highly conductive P type contact regions 118 and between emitter electrodes 140 and body 116 at conduction channels 128 may be locally tailored. For example, those metal/semiconductor interfaces may be locally tailored by doping or by dopant segregation, or by the addition of a dielectric interfacial layer (not shown in FIG. 1A), in order to adjust the Schottky barrier.

Emitter layer 130 may be formed of any metal or metal stack forming a desirable contact with P type body 116 including highly conductive P type contact regions 118. Emitter electrodes 140 may be formed of any metal or metal stack exhibiting a suitably low Schottky barrier with respect to N type conduction channels 128 produced when power transistor 100 is on. For example, emitter electrodes 140 may include a rare earth metal, and may include a rare earth metal silicide. As a specific example, in some implementations, emitter electrodes 140 may include erbium and/or erbium silicide.

With respect to width 142 of emitter electrodes 140, emitter electrodes 140 should have width 142 at least great enough to span the width of respective conduction channels 128. However, in some implementations, emitter electrodes 140 may have width 142 equal to some small integer multiple of the width of conduction channels 128. Thus, width 142 may be in a range from less than approximately 10 nm to approximately 30 nm, for example.

Figure 1B:
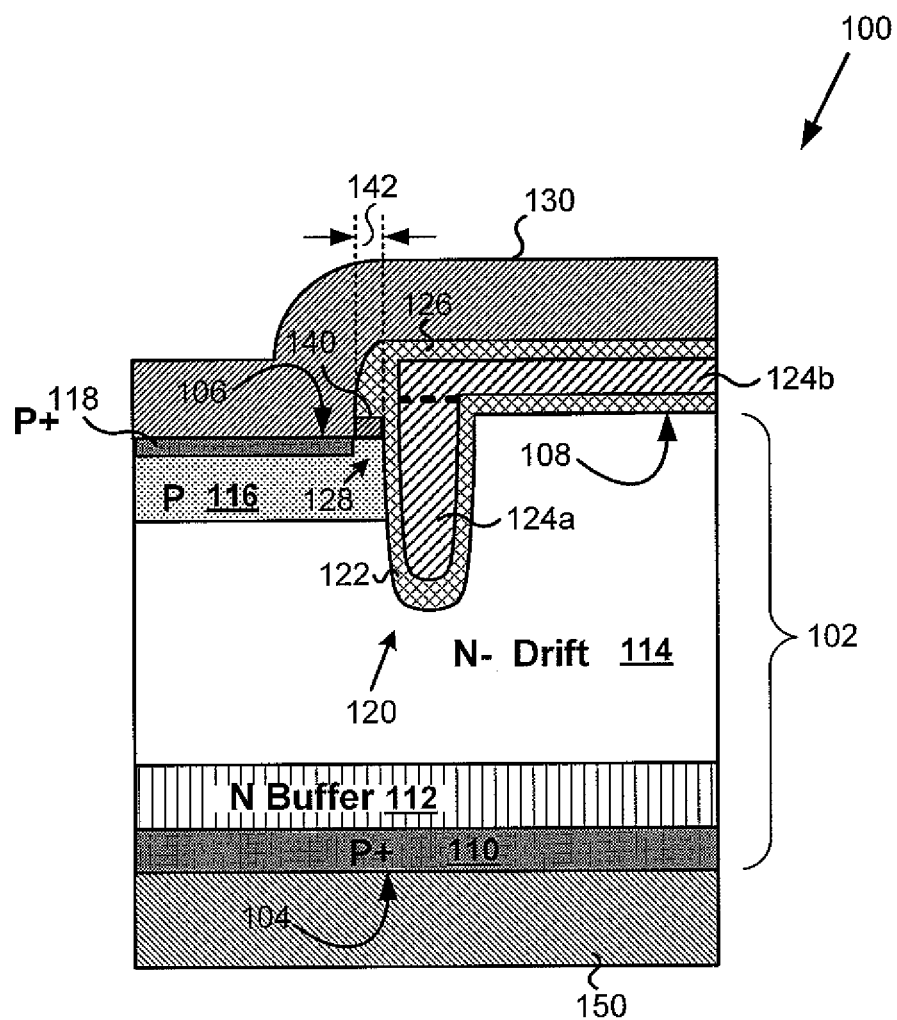
FIG. 1B presents a cross-sectional view showing a portion of the exemplary latch-up free power transistor of FIG. 1A from a different perspective.

Moving to FIG. 1B, FIG. 1B presents a cross-sectional view showing a portion of exemplary latch-up free power transistor 100 from a different perspective. In addition to the features shown in FIG. 1A, FIG. 1B shows top surface 108 of semiconductor substrate 102. As further shown in FIG. 1B, emitter electrodes 140 are situated in, and emitter layer 130 extends into, a recessed portion of semiconductor substrate 102 relative to top surface 108. That is to say, surface 106 at which emitter electrodes 140 and emitter layer 130 make direct physical contact with semiconductor substrate 102 is situated at a level below top surface 108 of semiconductor substrate 102.

The operation of power transistor 100 will now be described. When the voltage applied to insulated gates 120 is lower than the threshold voltage of power transistor 100, power transistor 100 is off and the PN junction formed by the interface of P type body 116 with N type drift region 114 is blocking. When the voltage applied to insulated gates 120 reaches the threshold voltage of power transistor 100, N type conduction channels 128 are produced. Electrons are injected through the junctions formed by the interface of emitter electrodes 140 with conduction channels 128, which may be reverse biased Schottky junctions. Such injection of electrons may occur due to thermionic emission, field emission (tunneling), and thermionic-field emission.

According to the implementation shown in FIG. 1A and FIG. 1B, the number of electrons injected through the junctions formed by the interface of electrodes 140 with conduction channels 128 depends on the metal or metals forming emitter electrodes 140. For example, the lower the Schottky barrier exhibited by emitter electrodes 140 to N type conduction channels 128, the higher the thermionic electron injection. Thus, according to the exemplary implementation shown in FIG. 1A and FIG. 1B, emitter electrodes 140 replace the highly doped emitter diffusions present in conventional IGBTs, thereby eliminating the parasitic bipolar transistor structure present in those conventional devices. Consequently, and in contrast to conventional IGBTs, power transistor 100 is advantageously configured to be latch-up free.

Figure 2:
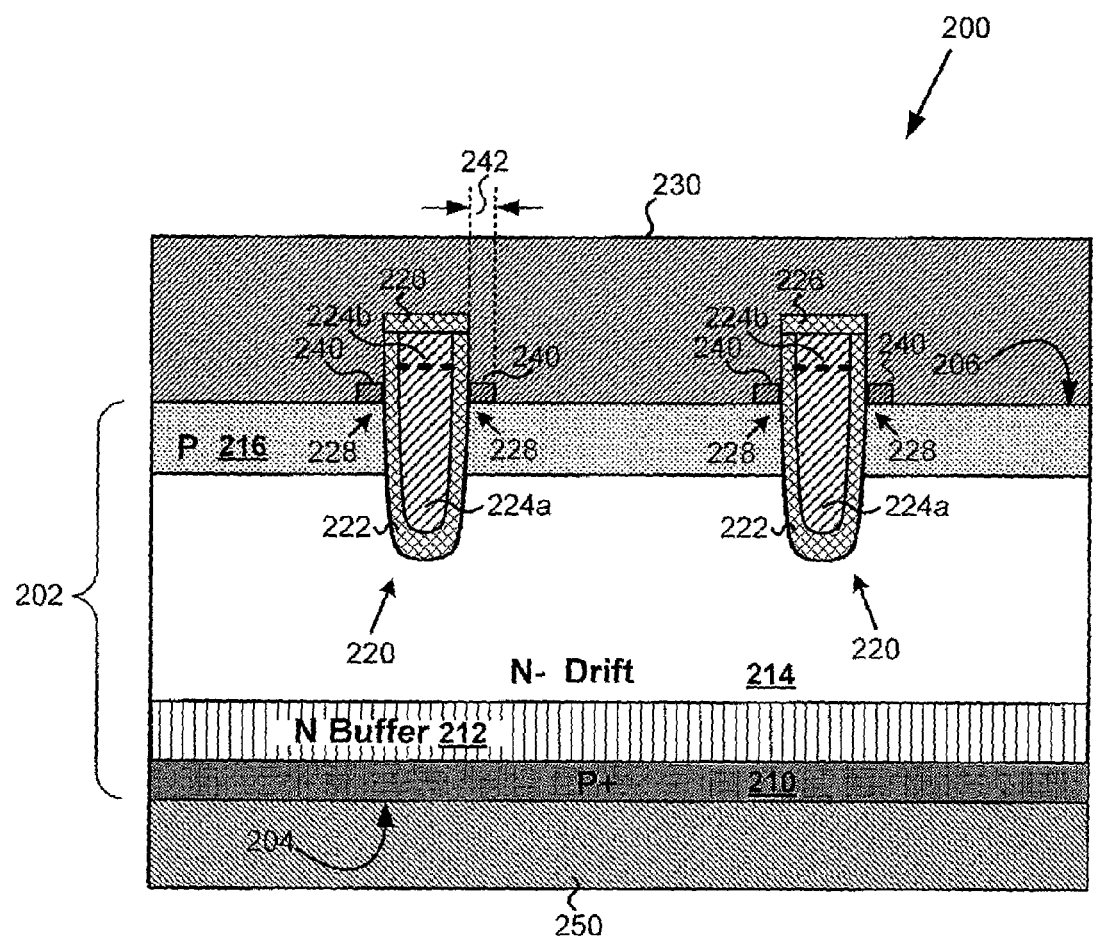
FIG. 2 presents a cross-sectional view showing a portion of an exemplary latch-up free power transistor, according to another implementation.

Referring now to FIG. 2, FIG. 2 presents a cross-sectional view showing a portion of exemplary latch-up free power transistor 200 in semiconductor substrate 202, according to another implementation. As shown in FIG. 2, power transistor 200 is implemented as an IGBT including P type collector 210 at bottom surface 204 of semiconductor substrate 202, and N type drift region 214 situated over P type collector 210. In addition, P type body 216 is situated over N type drift region 214. As further shown in FIG. 2, power transistor 200 also includes insulated gates 220 in the form of insulated gate trenches extending from surface 206 of semiconductor substrate 202 into N type drift region 214. Each of insulated gates 220 includes a respective gate insulator 222 and conductive gate electrode portions 224a and 224b.

Power transistor 200 further includes emitter layer 230 formed of a first metal, emitter electrodes 240 formed of a second metal and having width 242, and conduction channels 228 controlled by insulated gates 220. Conduction channels 228 provide a conductive path through P type body 216 in regions immediately adjacent insulated gates 220. Thus, when power transistor 200 is turned on, conduction channels 228 are produced as N type conductive paths through P type body 216 so as to electrically couple metal emitter electrode 240 to P type collector 210 via N type drift region 214. According to the implementation shown in FIG. 2, conduction channels 228 are N type channels.

Also shown in FIG. 2 is collector electrode 250 adjoining P type collector 210 and consequently also in electrical contact with conduction channels 228. In addition, power transistor 200 includes optional N type buffer or field stop layer 212 and dielectric layers 226.

Power transistor 200 corresponds in general to power transistor 100, in FIG. 1A and FIG. 1B. That is to say, semiconductor substrate 202, collector electrode 250, P type collector 210, optional N type buffer layer 212, and N type drift region 214, in FIG. 2, correspond respectively in general to semiconductor substrate 102, collector electrode 150, P type collector 110, optional N type buffer layer 112, and N type drift region 114, in FIG. 1A and FIG. 1B, and may share any of the characteristics attributed to those corresponding features, above. Moreover, insulated gates 220, dielectric layers 226, conduction channels 228, and emitter electrodes 240 having width 242, in FIG. 2, correspond respectively in general to insulated gates 120, dielectric layers 126, conduction channels 128, and emitter electrodes 140 having width 142, in FIG. 1A and FIG. 1B, and may share any of the characteristics attributed to those corresponding features, above.

It is noted that although not explicitly shown in FIG. 2, power transistor 200 shares additional features in common with power transistor 100 and shown in FIG. 1B. In other words, power transistor 200 further includes a semiconductor substrate top surface corresponding to top surface 108, in FIG. 1B, but not visible from the perspective shown in FIG. 2. Furthermore, and as described by reference to FIG. 1B, emitter electrodes 240 are situated in, and emitter layer 230 extends into, a recessed portion of semiconductor substrate 202 relative to the top surface corresponding to top surface 108. Consequently, surface 206 at which emitter electrodes 240 and emitter layer 230 make direct physical contact with semiconductor substrate 202 is situated at a level below the top surface of semiconductor substrate 202.

P type body 216, in FIG. 2, is similar to P type body 116 in FIG. 1A and FIG. 1B, with the exception that P type body 216 does not include a highly conductive P type contact region corresponding to any of highly conductive P type contact regions 118. In addition, and due to the omission by power transistor 200 of highly conductive P type contact regions corresponding to highly conductive P type contact regions 118, in FIG. 1A and FIG. 1B, emitter layer 230 is in direct physical contact with P type body 216 at surface 206 of semiconductor substrate 202, adjacent conduction channels 228. As a result, it may be advantageous or desirable for the junctions formed by the interface of emitter layer 230 with P type body 216 to exhibit a lower Schottky barrier with respect to P type than is optimal for the implementation shown in FIG. 1A and FIG. 1B. Thus, emitter layer 230 may be formed of the same metal or metal stack providing emitter layer 130, in FIG. 1A and FIG. 1B, or may be formed of a metal or metal stack exhibiting a lower Schottky barrier to P type than that used to provide emitter layer 130.

It is noted that the respective metal/semiconductor interfaces between emitter layer 230 and P type body 216 and between emitter electrodes 240 and body 216 at conduction channels 228 may be locally tailored. For example, those metal/semiconductor interfaces may be locally tailored by doping or by dopant segregation, or by the addition of a dielectric interfacial layer (not shown in FIG. 2), in order to adjust the Schottky barrier.

It is further noted that, as is the case for the representation of power transistor 100 by FIG. 1A and FIG. 1B, although power transistor 200 is depicted in FIG. 2 as having P type collector 210, optional N type buffer layer 212, N type drift region 214, P type body 216, and as being configured to produce N type conduction channels 228, that representation is merely exemplary. In other implementations, the described polarities can be reversed such that power transistor 200 may have an N type collector, an optional P type buffer layer, a P type drift region, and an N type body, and may be configured to produce a P type conduction channel. It is further noted that although power transistor 200 is shown to have a vertical IGBT structure, in other implementations, the present inventive principles can be readily adapted for use in a lateral IGBT device.

The operation of power transistor 200 is analogous to that of power transistor 100, in FIG. 1A and FIG. 1B. When the voltage applied to insulated gates 220 is lower than the threshold voltage of power transistor 200, power transistor 200 is off and the PN junction formed by the interface of P type body 216 with N type drift region 214 is blocking. When the voltage applied to insulated gates 220 reaches the threshold voltage of power transistor 200, N type conduction channels 228 are produced. Electrons are injected through the junctions formed by the interface of emitter electrodes 240 with conduction channels 228, which are reverse biased.

By further analogy to power transistor 100, injection of electrons into conduction channel 228 of power transistor 200 may occur due to thermionic emission, field emission (tunneling), and thermionic-field emission.

According to the implementation shown in FIG. 2, the number of electrons injected through the junctions formed by the interface of electrodes 240 with conduction channels 228 depends on the metal or metals forming emitter electrodes 240. For example, the lower the Schottky barrier exhibited by emitter electrodes 240 with respect to N type conduction channels 228, the higher the thermionic electron injection. Thus, according to the exemplary implementation shown in FIG. 2, emitter electrodes 240 replace the highly doped emitter diffusions present in conventional IGBTs, thereby eliminating the parasitic bipolar transistor structure present in those conventional devices. Consequently, and in contrast to conventional IGBTs, power transistor 200 is advantageously configured to be latch-up free.

Figure 3:
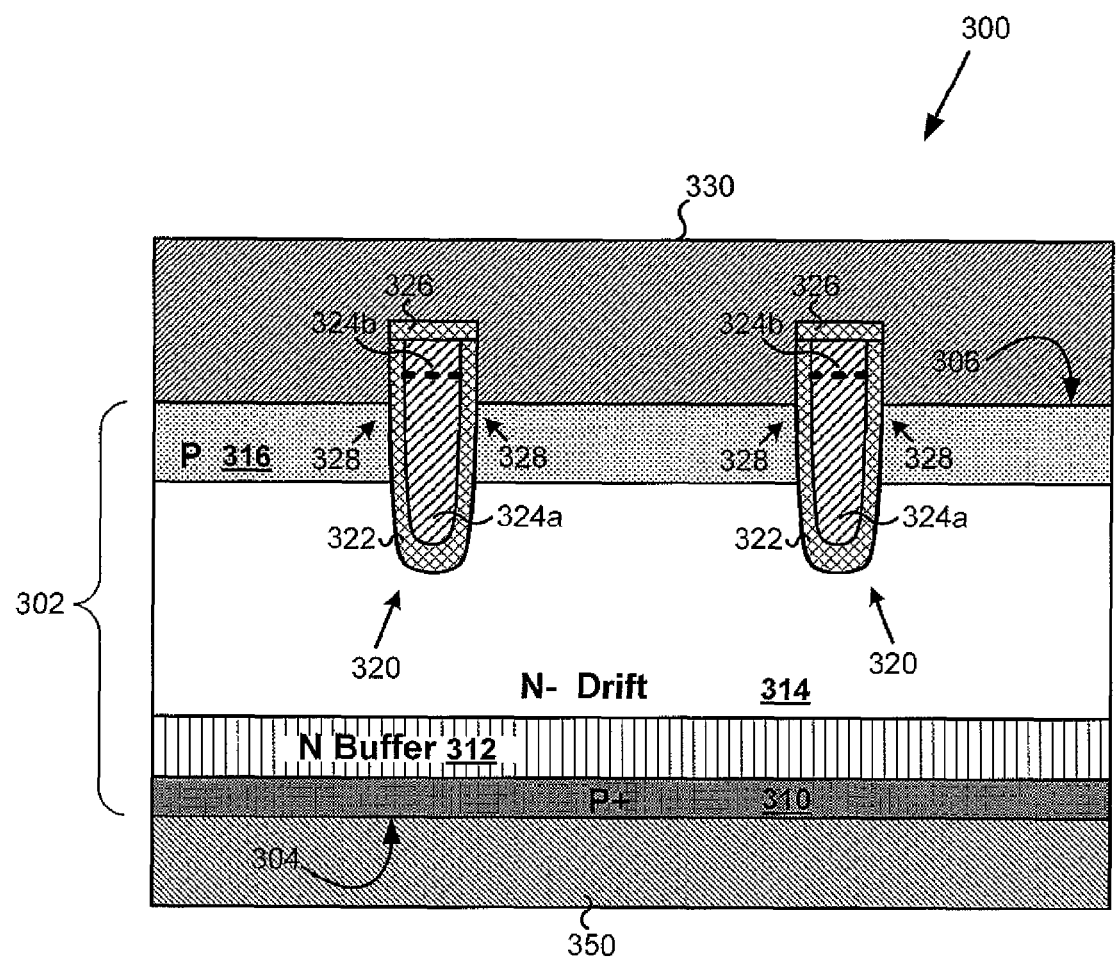
FIG. 3 presents a cross-sectional view showing a portion of an exemplary latch-up free power transistor, according to still another implementation.

Continuing to FIG. 3, FIG. 3 presents a cross-sectional view showing a portion of exemplary latch-up free power transistor 300 in semiconductor substrate 302, according to another implementation. As shown in FIG. 3, power transistor 300 is implemented as an IGBT including P type collector 310 at bottom surface 304 of semiconductor substrate 302, and N type drift region 314 situated over P type collector 310. In addition, P type body 316 is situated over N type drift region 314. As further shown in FIG. 3, power transistor 300 also includes insulated gates 320 in the form of insulated gate trenches extending from surface 306 of semiconductor substrate 302 into N type drift region 314. Each of insulated gates 320 includes a respective gate insulator 322 and conductive gate electrode portions 324a and 324b.

Power transistor 300 further includes emitter layer 330 formed of a metal, and conduction channels 328 controlled by insulated gates 320. Conduction channels 328 provide a conductive path through P type body 316 in regions immediately adjacent insulated gates 320. Thus, when power transistor 300 is turned on, conduction channels 328 are produced as N type conductive paths through P type body 316 so as to electrically couple metal emitter layer 330 to P type collector 310 via N type drift region 314. According to the implementation shown in FIG. 3, conduction channels 328 are N type channels.

Also shown in FIG. 3 is collector electrode 350 adjoining P type collector 310 and consequently also in electrical contact with conduction channels 328. In addition, power transistor 300 includes optional N type buffer or field stop layer 312 and dielectric layers 326.

Power transistor 300 corresponds in general to power transistor 100, in FIG. 1A and FIG. 1B. That is to say, semiconductor substrate 302, collector electrode 350, P type collector 310, optional N type buffer layer 312, and N type drift region 314, in FIG. 3, correspond respectively in general to semiconductor substrate 102, collector electrode 150, P type collector 110, optional N type buffer layer 112, and N type drift region 114, in FIG. 1A and FIG. 1B, and may share any of the characteristics attributed to those corresponding features, above. Moreover, insulated gates 320, dielectric layers 326, and conduction channels 328, in FIG. 3, correspond respectively in general to insulated gates 120, dielectric layers 126, and conduction channels 128 in FIG. 1A and FIG. 1B, and may share any of the characteristics attributed to those corresponding features, above.

It is noted that although not explicitly shown in FIG. 3, power transistor 300 shares additional features in common with power transistor 100 and shown in FIG. 1B. In other words, power transistor 300 further includes a semiconductor substrate top surface corresponding to top surface 108, in FIG. 1B, but not visible from the perspective shown in FIG. 3. Furthermore, and analogously to the description provided by reference to FIG. 1B, emitter layer 330 extends into a recessed portion of semiconductor substrate 302 relative to the top surface corresponding to top surface 108. Consequently, surface 306 at which emitter layer 330 make direct physical contact with semiconductor substrate 302 is situated at a level below the top surface of semiconductor substrate 302.

P type body 316, in FIG. 3, is similar to P type body 116 in FIG. 1A and FIG. 1B, with the exception that P type body 316 does not include a highly conductive P type contact region corresponding to any of highly conductive P type contact regions 118. In addition, power transistor 300 omits discrete emitter electrodes corresponding to emitter electrodes 140, in FIG. 1A and FIG. 1B. Due to those omissions from power transistor 300, emitter layer 330 is in direct physical contact with conduction channels 328, and is also in direct physical contact with P type body 316 adjacent conduction channels 328, at surface 306 of semiconductor substrate 302. As a result, it may be advantageous or desirable for the junctions formed by the interface of emitter layer 330 with N type conduction channels 328 to be substantially optimized for injection of electrons through those junctions when power transistor 300 is on. Thus, emitter layer 330 may be formed of the same metal or metal stack providing emitter layer 130, in FIG. 1A and FIG. 1B, or may be formed of a metal or metal stack exhibiting a lower Schottky barrier with respect to N type than that used to provide emitter layer 130.

It is noted that the respective metal/semiconductor interfaces between emitter layer 330 and P type body 316 and between emitter layer 330 and body 316 at conduction channels 328 may be locally tailored. For example, those metal/semiconductor interfaces may be locally tailored by doping or by dopant segregation, or by the addition of a dielectric interfacial layer (not shown in FIG. 3), in order to adjust the Schottky barrier.

It is further noted that, as is the case for the representation of power transistor 100 by FIG. 1A and FIG. 1B, although power transistor 300 is depicted in FIG. 3 as having P type collector 310, optional N type buffer layer 312, N type drift region 314, P type body 316, and as being configured to produce N type conduction channels 328, that representation is merely exemplary. In other implementations, the described polarities can be reversed such that power transistor 300 may have an N type collector, an optional P type buffer layer, a P type drift region, and an N type body, and may be configured to produce a P type conduction channel. It is further noted that although power transistor 300 is shown to have a vertical IGBT structure, in other implementations, the present inventive principles can be readily adapted for use in a lateral IGBT device.

The operation of power transistor 300 is analogous to that of power transistor 100, in FIG. 1A and FIG. 1B. When the voltage applied to insulated gates 320 is lower than the threshold voltage of power transistor 300, power transistor 300 is off and the PN junction formed by the interface of P type body 316 with N type drift region 314 is blocking. When the voltage applied to insulated gates 320 reaches the threshold voltage of power transistor 300, N type conduction channels 328 are produced. Electrons are injected through the junctions formed by the interface of emitter layer 330 with conduction channels 328, which are reverse biased. By further analogy to power transistor 100, injection of electrons into conduction channel 328 of power transistor 300 may occur due to thermionic emission, field emission (tunneling), and thermionic-field emission.

According to the implementation shown in FIG. 3, the number of electrons injected through the junctions formed by the interface of emitter layer 330 with conduction channels 328 depends on the metal or metals forming emitter layer 330. For example, the lower the Schottky barrier exhibited by emitter layer 330 with respect to N type conduction channels 328, the higher the thermionic electron injection. Thus, according to the exemplary implementation shown in FIG. 3, emitter layer 330 replaces the highly doped emitter diffusions present in conventional IGBTs, thereby eliminating the parasitic bipolar transistor structure present in those conventional devices. Consequently, and in contrast to conventional IGBTs, power transistor 300 is advantageously configured to be latch-up free.

Figure 4:
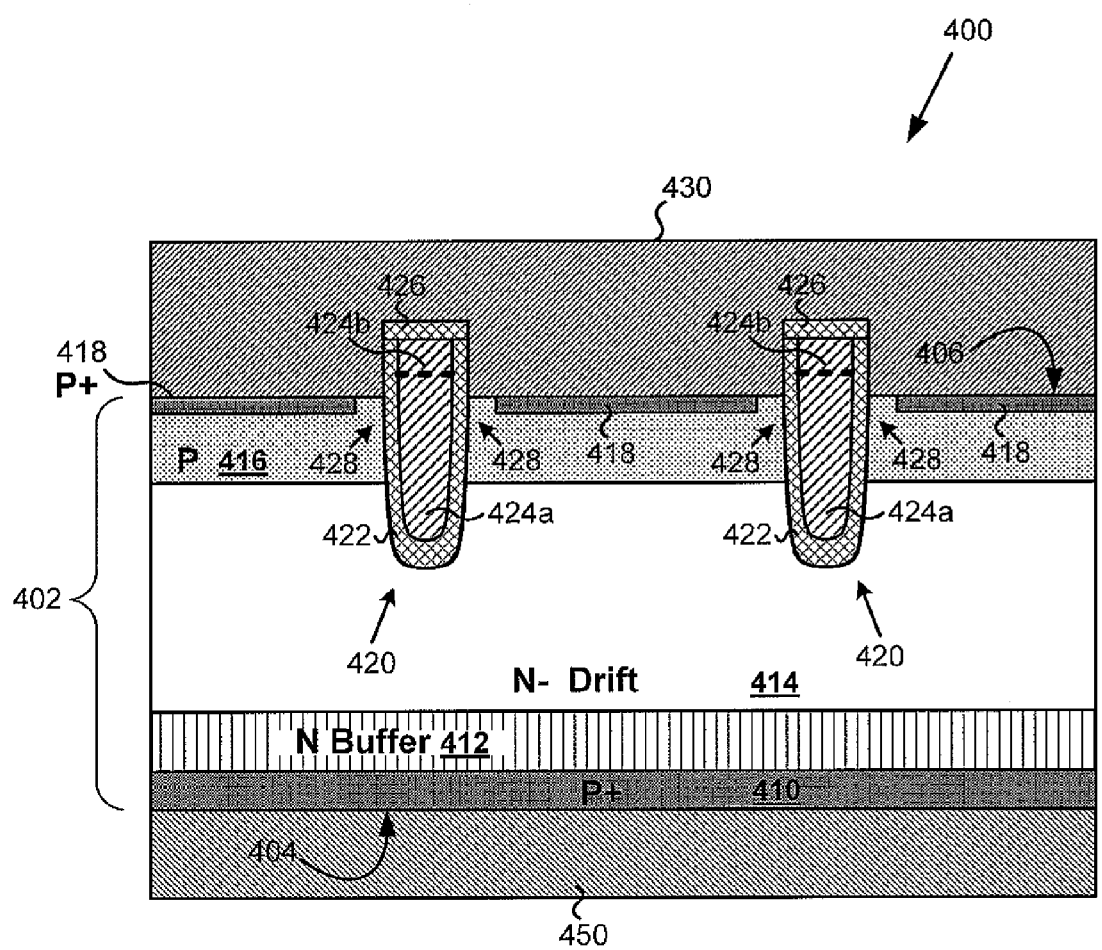
FIG. 4 presents a cross-sectional view showing a portion of an exemplary latch-up free power transistor, according to yet another implementation.

Moving to FIG. 4, FIG. 4 presents a cross-sectional view showing a portion of exemplary latch-up free power transistor 400 in semiconductor substrate 402, according to yet another implementation. As shown in FIG. 4, power transistor 400 is implemented as an IGBT including P type collector 410 at bottom surface 404 of semiconductor substrate 402, and N type drift region 414 situated over P type collector 410. In addition, P type body 416 is situated over N type drift region 414. As further shown in FIG. 4, power transistor 400 also includes insulated gates 420 in the form of insulated gate trenches extending from surface 406 of semiconductor substrate 402 into N type drift region 414. Each of insulated gates 420 includes a respective gate insulator 422 and conductive gate electrode portions 424a and 424b.

Power transistor 400 further includes emitter layer 430 formed of a metal, and conduction channels 428 controlled by insulated gates 420. Conduction channels 428 provide a conductive path through P type body 416 in regions immediately adjacent insulated gates 420. Thus, when power transistor 400 is turned on, conduction channels 428 are produced as N type conductive paths through P type body 416 so as to electrically couple metal emitter layer 430 to P type collector 410 via N type drift region 414. According to the implementation shown in FIG. 4, conduction channels 428 are N type channels.

Also shown in FIG. 4 is collector electrode 450 adjoining P type collector 410 and consequently also in electrical contact with conduction channels 428. In addition, power transistor 400 includes optional N type buffer or field stop layer 412 and dielectric layers 426.

Power transistor 400 corresponds in general to power transistor 100, in FIG. 1A and FIG. 1B. That is to say, semiconductor substrate 402, collector electrode 450, P type collector 410, optional N type buffer layer 412, and N type drift region 414, in FIG. 4, correspond respectively in general to semiconductor substrate 102, collector electrode 150, P type collector 110, optional N type buffer layer 112, and N type drift region 114, in FIG. 1A and FIG. 1B, and may share any of the characteristics attributed to those corresponding features, above. Moreover, P type body 416 including highly conductive P type contact regions 418, insulated gates 420, dielectric layers 426, and conduction channels 428, in FIG. 4, correspond respectively in general to P type body 116 including highly conductive P type contact regions 118, insulated gates 120, dielectric layers 126, and conduction channels 128, in FIG. 1A and FIG. 1B, and may share any of the characteristics attributed to those corresponding features, above.

It is noted that although not explicitly shown in FIG. 4, power transistor 400 shares additional features in common with power transistor 100 and shown in FIG. 1B. In other words, power transistor 400 further includes a semiconductor substrate top surface corresponding to top surface 108, in FIG. 1B, but not visible from the perspective shown in FIG. 4. Furthermore, and analogously to the description provided by reference to FIG. 1B, emitter layer 430 extends into a recessed portion of semiconductor substrate 402 relative to the top surface corresponding to top surface 108. Consequently, surface 406 at which emitter layer 430 make direct physical contact with semiconductor substrate 402 is situated at a level below the top surface of semiconductor substrate 402.

In contrast to power transistor 100, power transistor 400, in FIG. 4, omits discrete emitter electrodes corresponding to emitter electrodes 140, in FIG. 1A and FIG. 1B. In addition, and due to the omission by power transistor 400 of such discrete emitter electrodes, emitter layer 430 is in direct physical contact with conduction channels 428, and is also in direct physical contact with highly conductive P type contact regions 418 of P type body 416 adjacent conduction channels 428, at surface 406 of semiconductor substrate 402. As a result, it may be advantageous or desirable for the junctions formed by the interface of emitter layer 430 with N type conduction channels 428 to be substantially optimized for injection of electrons through those junctions when power transistor 400 is on. Thus, emitter layer 430 may be formed of the same metal or metal stack providing emitter layer 130, in FIG. 1A and FIG. 1B, or may be formed of a metal or metal stack exhibiting a lower Schottky barrier with respect to N type than that used to provide emitter layer 130.

It is noted that the respective metal/semiconductor interfaces between emitter layer 430 and highly conductive P type contact regions 418 of P type body 416 and between emitter layer 430 and conduction channels 428 may be locally tailored. For example, those metal/semiconductor interfaces may be locally tailored by doping or by dopant segregation, or by the addition of a dielectric interfacial layer (not shown in FIG. 4), in order to adjust the Schottky barrier.

It is further noted that, as is the case for the representation of power transistor 100 by FIG. 1A and FIG. 1B, although power transistor 400 is depicted in FIG. 4 as having P type collector 410, optional N type buffer layer 412, N type drift region 414, P type body 416, and as being configured to produce N type conduction channels 428, that representation is merely exemplary. In other implementations, the described polarities can be reversed such that power transistor 400 may have an N type collector, an optional P type buffer layer, a P type drift region, and an N type body, and may be configured to produce a P type conduction channel. It is further noted that although power transistor 400 is shown to have a vertical IGBT structure, in other implementations, the present inventive principles can be readily adapted for use in a lateral IGBT device.

The operation of power transistor 400 is analogous to that of power transistor 100, in FIG. 1A and FIG. 1B. When the voltage applied to insulated gates 420 is lower than the threshold voltage of power transistor 400, power transistor 400 is off and the PN junction formed by the interface of P type body 416 with N type drift region 414 is blocking. When the voltage applied to insulated gates 420 reaches the threshold voltage of power transistor 400, N type conduction channels 428 are produced. Electrons are injected through the junctions formed by the interface of emitter layer 430 with conduction channels 428, which are reverse biased. By further analogy to power transistor 100, injection of electrons into conduction channel 428 of power transistor 400 may occur due to thermionic emission, field emission (tunneling), and thermionic-field emission.

According to the implementation shown in FIG. 4, the number of electrons injected through the junctions formed by the interface of emitter layer 430 with conduction channels 428 depends on the metal or metals forming emitter layer 430. For example, the lower the Schottky barrier exhibited by emitter layer 430 with respect to N type conduction channels 428, the higher the thermionic electron injection. Thus, according to the exemplary implementation shown in FIG. 4, emitter layer 430 replaces the highly doped emitter diffusions present in conventional IGBTs, thereby eliminating the parasitic bipolar transistor structure present in those conventional devices. Consequently, and in contrast to conventional IGBTs, power transistor 400 is advantageously configured to be latch-up free.

Figure 5:
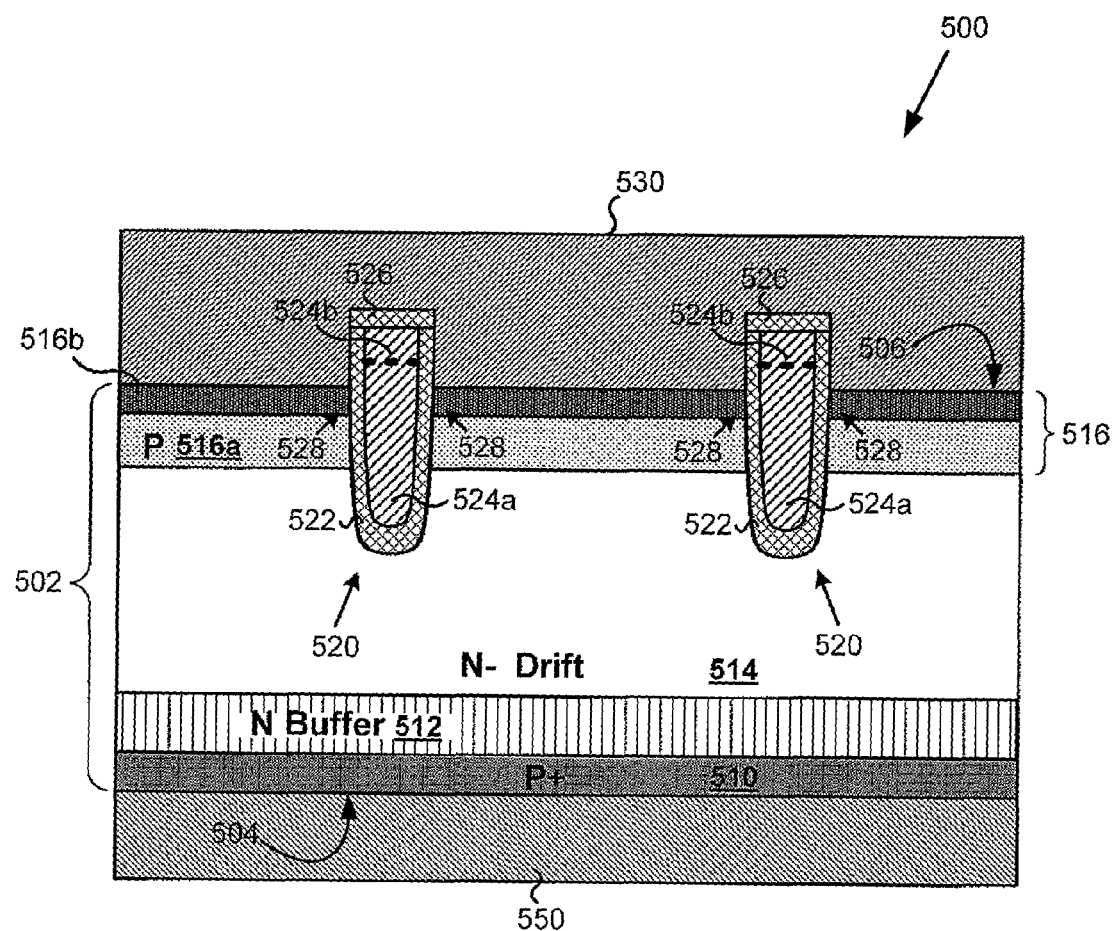
FIG. 5 presents a cross-sectional view showing a portion of an exemplary latch-up free power transistor, according to a further implementation.

Continuing to FIG. 5, FIG. 5 presents a cross-sectional view showing a portion of exemplary latch-up free power transistor 500 in semiconductor substrate 502, according to another implementation. As shown in FIG. 5, power transistor 500 is implemented as an IGBT including P type collector 510 at bottom surface 504 of semiconductor substrate 502, and N type drift region 514 situated over P type collector 510. In addition, P type body 516 is situated over N type drift region 514. As further shown in FIG. 5, power transistor 500 also includes insulated gates 520 in the form of insulated gate trenches extending from surface 506 of semiconductor substrate 502 into N type drift region 514. Each of insulated gates 520 includes a respective gate insulator 522 and conductive gate electrode portions 524*a* and 524*b*.

Power transistor 500 further includes emitter layer 530 formed of a metal, and conduction channels 528 controlled by insulated gates 520. Conduction channels 528 provide a conductive path through P type body 516 in regions immediately adjacent insulated gates 520. Thus, when power transistor 500 is turned on, conduction channels 528 are produced as N type conductive paths through P type body 516 so as to electrically couple metal emitter layer 530 to P type collector 510 via N type drift region 514. According to the implementation shown in FIG. 5, conduction channels 528 are N type channels.

Also shown in FIG. 5 is collector electrode 550 adjoining P type collector 510 and consequently also in electrical contact with conduction channels 528. In addition, power transistor 500 includes optional N type buffer or field stop layer 512, P type bottom body semiconductor material 516*a* in contact with N type drift region 514, P type top body semiconductor material 516*b*, and dielectric layers 526.

Power transistor 500 corresponds in general to power transistor 100, in FIG. 1A and FIG. 1B. That is to say, collector electrode 550, P type collector 510, optional N type buffer layer 512, and N type drift region 514, in FIG. 5, correspond respectively in general to collector electrode 150, P type collector 110, optional N type buffer layer 112, and N type drift region 114, in FIG. 1A and FIG. 1B, and may share any of the characteristics attributed to those corresponding features, above. Moreover, P type bottom body semiconductor material 516*a*, insulated gates 520, dielectric layers 526, and conduction channels 528, in FIG. 5, correspond respectively in general to P type body 116, insulated gates 120, dielectric layers 126, and conduction channels 128, in FIG. 1A and FIG. 1B, and may share any of the characteristics attributed to those corresponding features, above.

It is noted that although not explicitly shown in FIG. 5, power transistor 500 shares additional features in common with power transistor 100 and shown in FIG. 1B. In other words, power transistor 500 further includes a semiconductor substrate top surface corresponding to top surface 108, in FIG. 1B, but not visible from the perspective shown in FIG. 5. Furthermore, and analogously to the description provided by reference to FIG. 1B, emitter layer 530 extends into a recessed portion of semiconductor substrate 502 relative to the top surface corresponding to top surface 108. Consequently, surface 506 at which emitter layer 530 make direct physical contact with semiconductor substrate 502 is situated at a level below the top surface of semiconductor substrate 502.

As further shown in FIG. 5, in addition to P type bottom body semiconductor material 516*a*, P type body 516 also includes P type top body semiconductor material 516*b* formed over and adjoining P type bottom body semiconductor material 516*a*. P type top body semiconductor material 516*b* may be formed as a germanium (Ge) containing layer of semiconductor substrate 502, such as a Ge, SiGe, or silicon germanium tin (SiGeSn) layer, for example. It is noted that P type bottom body semiconductor material 516*a* and P type top body semiconductor material 516*b* adjoin insulated gates 520.

As noted above, insulated gates 520 are situated adjacent conduction channels 528 in power transistor 500. Moreover, conduction channels 528 are in direct physical contact with emitter layer 530 at surface 506 of semiconductor substrate 502 and with collector electrode 550 at bottom surface 504 of semiconductor substrate 502. As further shown in FIG. 5, emitter layer 530 is also in direct physical contact with P type top body semiconductor material 516*b* of P type body 516 adjacent conduction channels 528, at surface 506 of semiconductor substrate 502.

Thus, according to the present implementation, emitter layer 530 adjoins and makes direct physical contact with P type top body semiconductor material 516*b* of P type body 516, and also makes direct physical contact with N type conduction channels 528. Emitter layer 530 may be formed of any metal or metal stack forming a desirable contact with P type top body semiconductor material 516*b* and N type conduction channels 528.

It is noted that the metal/semiconductor interface between emitter layer 530 and P type top body semiconductor material 516*b* may be locally tailored, for example, by doping or by dopant segregation, or by the addition of a dielectric interfacial layer (not shown in FIG. 5), in order to adjust the Schottky barrier. In addition, it is noted that in some implementations, P type top body semiconductor material 516*b* can be structured. For example, P type top body semiconductor material 516*b* can be structured so as to be situated only in conduction channels 528. In those latter implementations, the respective metal/semiconductor interfaces between emitter layer 530 and P type bottom body semiconductor material 516*a* and between emitter layer 530 and P type top body semiconductor material 516*b* and conduction channels 528 may be locally tailored as described above.

It is further noted that, although not explicitly shown in FIG. 5, in some implementations, power transistor 500 may also include emitter electrodes corresponding to emitter electrodes 140, in FIG. 1A and FIG. 1B, and sharing any of the characteristics attributed to those corresponding features, above. In such implementations, conduction channels 528 are in direct physical contact with those emitter electrodes at surface 506 of semiconductor substrate 502 and with collector electrode 550 at bottom surface 504 of semiconductor substrate 502. Moreover, in those implementations, emitter layer 530 is in direct physical contact with P type top body semiconductor material 516b of P type body 516 at surface 506 of semiconductor substrate 502, adjacent conduction channels 528. Thus, according to those implementations, emitter layer 530 adjoins and makes direct physical contact with P type top body semiconductor material 516b of P type body 516, while the emitter electrodes (not shown in FIG. 5) would be in direct physical contact with body 516 at conduction channels 528.

It is further noted that although the implementation shown in FIG. 5 depicts power transistor 500 as having P type collector 510, optional N type buffer layer 512, N type drift region 514, P type body 516, and as being configured to produce N type conduction channels 528, that representation is merely exemplary. In other implementations, the described polarities can be reversed such that power transistor 500 may have an N type collector, an optional P type buffer layer, a P type drift region, and an N type body, and may be configured to produce a P type conduction channel. Furthermore, although power transistor 500 is shown to have a vertical IGBT structure, in other implementations, the present inventive principles can be readily adapted for use in a lateral IGBT device.

The operation of power transistor 500 is analogous to that of power transistor 100, in FIG. 1A and FIG. 1B. When the voltage applied to insulated gates 520 is lower than the threshold voltage of power transistor 500, power transistor 500 is off and the PN junction formed by the interface of P type bottom body semiconductor material 516a with N type drift region 514 is blocking. When the voltage applied to insulated gates 520 reaches the threshold voltage of power transistor 500, N type conduction channels 528 are produced. Electrons are injected through the junctions formed by the interface of emitter layer 530 with conduction channels 528, which are reverse biased. By further analogy to power transistor 100, injection of electrons into conduction channel 528 of power transistor 500 may occur due to thermionic emission, field emission (tunneling), and thermionic-field emission.

According to the implementation shown in FIG. 5, the number of electrons injected through the junctions formed by the interface of emitter layer 530 with conduction channels 528 depends on the metal or metals forming emitter layer 530. For example, the lower the Schottky barrier exhibited by emitter layer 530 with respect to N type conduction channels 528, the higher the thermionic electron injection. Thus, according to the exemplary implementation shown in FIG. 5, emitter layer 530 replaces the highly doped emitter diffusions present in conventional IGBTs, thereby eliminating the parasitic bipolar transistor structure present in those conventional devices. Consequently, and in contrast to conventional IGBTs, power transistor 500 is advantageously configured to be latch-up free.

Figure 6:
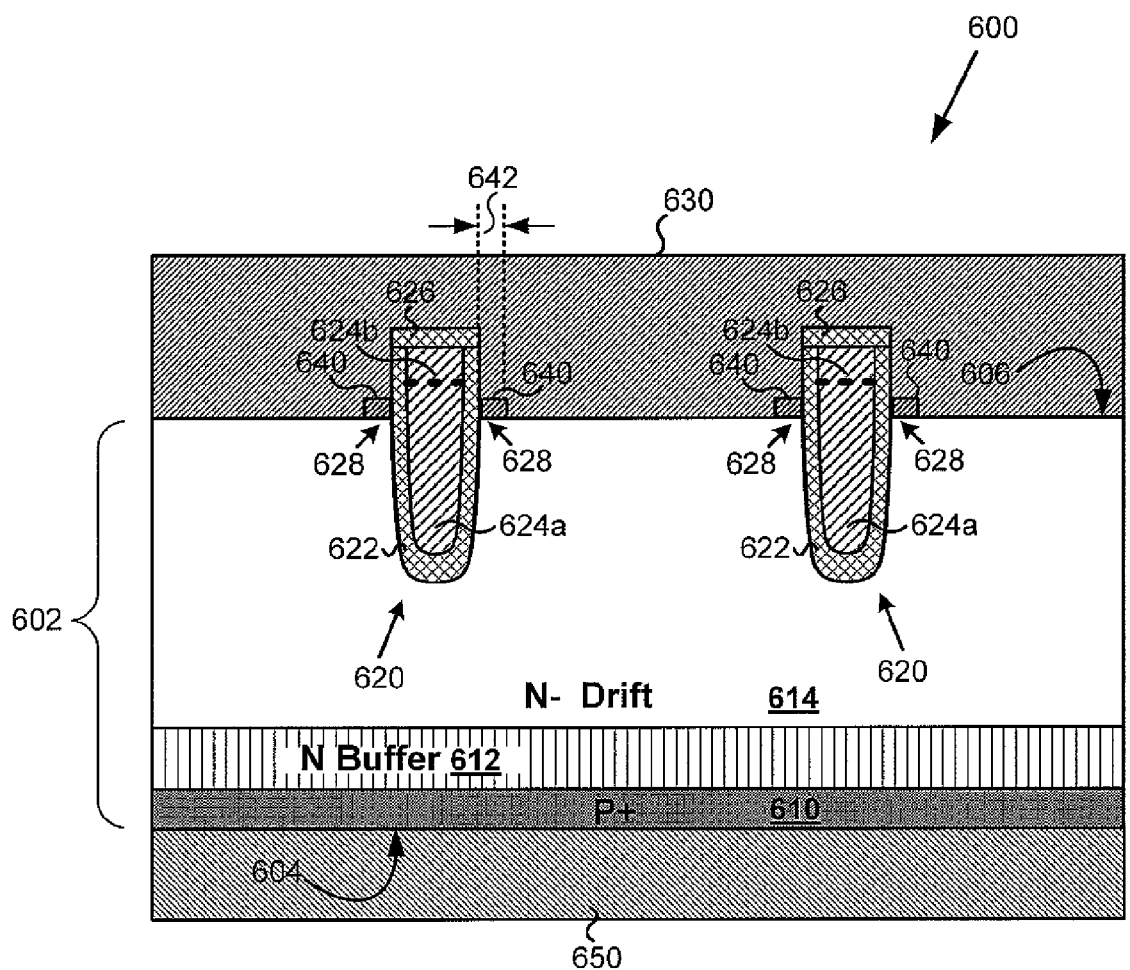
FIG. 6 presents a cross-sectional view showing a portion of an exemplary latch-up free power transistor, according to another implementation.

Referring to FIG. 6, FIG. 6 presents a cross-sectional view showing a portion of exemplary latch-up free power transistor 600 in semiconductor substrate 602, according to another implementation. As shown in FIG. 6, power transistor 600 includes P type collector 610 at bottom surface 604 of semiconductor substrate 602, and N type drift region 614 situated over P type collector 610. As further shown in FIG. 6, power transistor 600 also includes insulated gates 620 in the form of insulated gate trenches extending from surface 606 of semiconductor substrate 602 into N type drift region 614. Each of insulated gates 620 includes a respective gate insulator 622 and conductive gate electrode portions 624a and 624b.

Power transistor 600 further includes emitter layer 630 formed of a first metal, emitter electrodes 640 formed of a second metal and having width 642, and conduction channels 628 controlled by insulated gates 620. Conduction channels 628 provide a conductive path in regions immediately adjacent insulated gates 620. Thus, when power transistor 600 is turned on, conduction channels 628 electrically couple metal emitter electrode 640 to P type collector 610 via N type drift region 614. According to the implementation shown in FIG. 6, conduction channels 628 are N type channels.

Also shown in FIG. 6 is collector electrode 650 adjoining P type collector 610 and consequently also in electrical contact with conduction channels 628. In addition, power transistor 600 includes optional N type buffer or field stop layer 612, and dielectric layers 626.

It is noted that although the implementation shown in FIG. 6 depicts power transistor 600 as having P type collector 610, optional N type buffer layer 612, N type drift region 614, and as being configured to provide N type conduction channels 628, that representation is merely exemplary. In other implementations, the described polarities can be reversed such that power transistor 600 may have an N type collector, an optional P type buffer layer, a P type drift region, and may be configured to provide a P type conduction channel. It is further noted that although power transistor 600 is shown to have a vertical structure, in other implementations, the present inventive principles can be readily adapted for use in a lateral device.

Semiconductor substrate 602 may be a silicon (Si) substrate or a silicon carbide (SiC) substrate, for example. In some implementations, semiconductor substrate 602 may include N type drift region 614 formed in an epitaxial silicon layer of semiconductor substrate 602. Formation of such an epitaxial silicon layer may be performed by any suitable method, as known in the art, such as CVD or MBE, for example. More generally, however, N type drift region 614 may be formed in any suitable elemental or compound semiconductor layer included in semiconductor substrate 602.

Thus, in other implementations, N type drift region 614 need not be formed through epitaxial growth, and/or need not be formed of silicon. For example, in one alternative implementation, N type drift region 614 can be formed in a float zone silicon layer of semiconductor substrate 602. In other implementations, N type drift region 614 can be formed in either a strained or unstrained germanium layer formed as part of semiconductor substrate 602. Moreover, in some implementations, semiconductor substrate 602 may include additional layers, such as N type buffer or field stop layer 612 situated between P type collector 610 and N type drift region 614, as shown in FIG. 6.

Gate insulator 622 and dielectric layers 626 may be formed using any material and any technique typically employed in the art. For example, gate insulator 622 and dielectric layers 626 may be formed of silicon oxide, and may be deposited or thermally grown to produce gate insulator 622 and dielectric layers 626. Conductive gate electrode portions 624a and 624b may also be formed using any material typically utilized in the art. For example, conductive gate electrode portions 624a and 624b may be formed of doped polysilicon or metal.

In some implementations, it may be advantageous or desirable for conductive gate electrodes to be doped so as to have a conductivity type opposite that of drift region 614, so as to deplete conduction channels 628 when power transistor 600 is off. Thus, according to the implementation shown in FIG. 6, in which drift region 614 is N type, conductive gate electrode portions 624a and 624b may be P type doped, while in implementations in which drift region 614 is P type, conductive gate electrode portions 624a and 624b may be N type doped. Alternatively, conductive gate electrode portions 624a and 624b may be formed of a metal having a suitable work function to ensure depletion of conduction channels 628 when power transistor 600 is off. It is noted that although the electrical connection among the conductive gate electrodes of power transistor 600 is not explicitly shown in the cross-sectional perspective provided by FIG. 6, conductive gate electrode portions 624b can be shorted together in the third dimension relative to the cross-sectional plane of FIG. 6.

As noted above, insulated gates 620 are situated adjacent conduction channels 628 in power transistor 600. Moreover, conduction channels 628 are in direct physical contact with emitter electrodes 640 at surface 606 of semiconductor substrate 602 and with collector electrode 650 at bottom surface 604 of semiconductor substrate 602. As further shown in FIG. 6, emitter layer 630 is in direct physical contact with surface 606 of semiconductor substrate 602 adjacent conduction channels 628. Thus, according to the present implementation, emitter layer 630 adjoins and makes direct physical contact with N type drift region 614, while emitter electrodes 640 are in direct physical contact with N type drift region 614 at channels 628.

It is noted that the respective metal/semiconductor interfaces between emitter layer 630 and N type drift region 614 and between emitter electrodes 640 and N type drift region 614 at conduction channels 628 may be locally tailored. For example, those metal/semiconductor interfaces may be locally tailored by doping or by dopant segregation, or by the addition of a dielectric interfacial layer (not shown in FIG. 6), in order to adjust the Schottky barrier.

Emitter layer 630 may be formed of any metal or metal stack forming a desirable contact with N type drift region 614. Emitter electrodes 640 may be formed of any metal or metal stack exhibiting a suitably low Schottky barrier with respect to N type conduction channels 628 when power transistor 600 is on. For example, emitter layer 630 may be formed as an aluminum layer, while emitter electrodes 640 may include a rare earth metal, and may include a rare earth metal silicide. As a specific example, in some implementations, emitter electrodes 640 may include erbium and/or erbium silicide.

With respect to width 642 of emitter electrodes 640, emitter electrodes 640 should have width 642 at least great enough to span the width of respective conduction channels 628. However, in some implementations, emitter electrodes 640 may have width 642 equal to some small integer multiple of the width of conduction channels 628. Thus, width 642 may be in a range from less than approximately 10 nm to approximately 30 nm, for example.

It is noted that although not explicitly shown in FIG. 6, power transistor 600 shares certain features in common with power transistor 100 and shown in FIG. 1B. Specifically, power transistor 600 further includes a semiconductor substrate top surface corresponding to top surface 108, in FIG. 1B, but not visible from the perspective shown in FIG. 6. Furthermore, and as described by reference to FIG. 1B, emitter electrodes 640 are situated in, and emitter layer 630 extends into, a recessed portion of semiconductor substrate 602 relative to the top surface corresponding to top surface 108. Consequently, surface 606 at which emitter electrodes 640 and emitter layer 630 make direct physical contact with semiconductor substrate 602 is situated at a level below the top surface of semiconductor substrate 602.

The operation of power transistor 600 will now be described. When the voltage applied to insulated gates 620 is lower than the threshold voltage of power transistor 600, power transistor 600 is off. In that off state, the junctions formed by the interface of emitter layer 630 with N type drift region 614 and the interface of emitter electrodes 640 with conduction channels 628 are blocking. When the voltage applied to insulated gates 620 reaches the threshold voltage of power transistor 600, electrons are injected through the junctions formed by the interface of emitter electrodes 640 with conduction channels 628, which are reverse biased. Such injection of electrons may occur due to thermionic emission, field emission (tunneling), and thermionic-field emission.

Thus, according to the exemplary implementation shown in FIG. 6, the parasitic bipolar transistor structure present in some conventional power transistors is eliminated. Consequently, and in contrast to such conventional power devices, power transistor 600 is advantageously configured to be latch-up free.

Figure 7:
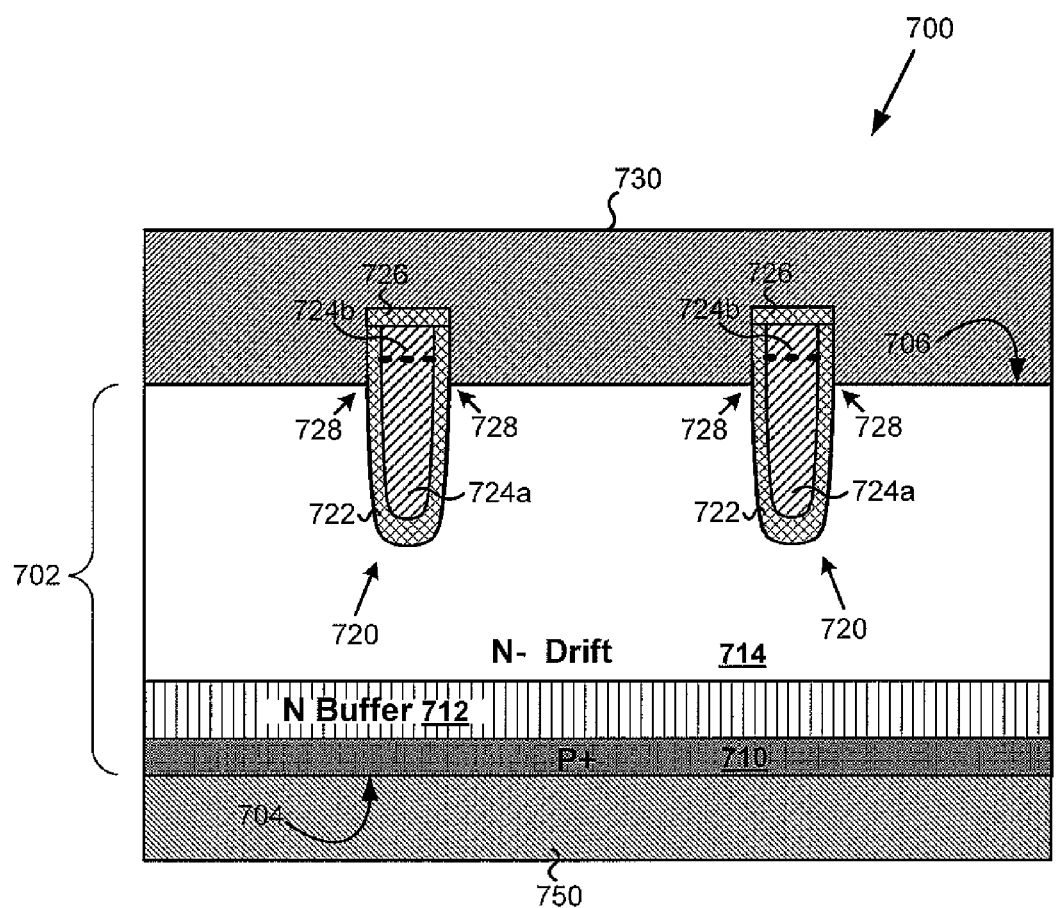
FIG. 7 presents a cross-sectional view showing a portion of an exemplary latch-up free power transistor, according to another implementation.

Moving to FIG. 7, FIG. 7 presents a cross-sectional view showing a portion of exemplary latch-up free power transistor 700 in semiconductor substrate 702, according to another implementation. As shown in FIG. 7, power transistor 700 includes P type collector 710 at bottom surface 704 of semiconductor substrate 702, and N type drift region 714 situated over P type collector 710. As further shown in FIG. 7, power transistor 700 also includes insulated gates 720 in the form of insulated gate trenches extending from surface 706 of semiconductor substrate 702 into N type drift region 714. Each of insulated gates 720 includes a respective gate insulator 722 and conductive gate electrode portions 724a and 724b.

Power transistor 700 further includes emitter layer 730 formed of a metal, and conduction channels 728 controlled by insulated gates 720. Conduction channels 728 provide a conductive path in regions immediately adjacent insulated gates 720. Thus, when power transistor 700 is turned on, conduction channels 728 electrically couple metal emitter layer 730 to P type collector 710 via N type drift region 714. According to the implementation shown in FIG. 7, conduction channels 728 are N type channels.

Also shown in FIG. 7 is collector electrode 750 adjoining P type collector 710 and consequently also in electrical contact with conduction channels 728. In addition, power transistor 700 includes optional N type buffer or field stop layer 712, and dielectric layers 726.

Power transistor 700 corresponds in general to power transistor 700, in FIG. 6. That is to say, semiconductor substrate 702, collector electrode 750, P type collector 710, optional N type buffer layer 712, and N type drift region 714, in FIG. 7, correspond respectively in general to semiconductor substrate 602, collector electrode 650, P type collector 610, optional N type buffer layer 612, and N type drift region 614, in FIG. 6, and may share any of the characteristics attributed to those corresponding features, above. Moreover, insulated gates 720 including respective gate conductive gate electrode portions 724a and 724b, dielectric layers 726, and conduction channels 728, in FIG. 7, correspond respectively in general to insulated gates 620 in including respective conductive gate electrode portions 624a and 624b, dielectric layers 626, and conduction channels 628 in FIG. 6, and may share any of the characteristics attributed to those corresponding features, above.

It is noted that although not explicitly shown in FIG. 7, power transistor 700 shares certain features in common with power transistor 100 and shown in FIG. 1B. Specifically, power transistor 700 further includes a semiconductor substrate top surface corresponding to top surface 108, in FIG. 1B, but not visible from the perspective shown in FIG. 7. Furthermore, and analogously to the description provided by reference to FIG. 1B, emitter layer 730 extends into a recessed portion of semiconductor substrate 702 relative to the top surface corresponding to top surface 108. Consequently, surface 706 at which emitter layer 730 make direct physical contact with semiconductor substrate 702 is situated at a level below the top surface of semiconductor substrate 702.

However, in contrast to power transistor 600, power transistor 700 omits discrete emitter electrodes corresponding to emitter electrodes 640. Due to that omission from power transistor 700, emitter layer 730 is in direct physical contact with conduction channels 728, and is also in direct physical contact with N type drift region 714 adjacent conduction channels 728, at surface 706 of semiconductor substrate 702. As a result, it may be advantageous or desirable for the junctions formed by the interface of emitter layer 730 with N type conduction channels 728 to be substantially optimized for injection of electrons through those junctions when power transistor 700 is on. Thus, emitter layer 730 may be formed of the same metal or metal stack providing emitter layer 630, in FIG. 6, or may be formed of a metal or metal stack exhibiting a lower Schottky barrier with respect to N type than that used to provide emitter layer 630.

It is noted that the respective metal/semiconductor interfaces between emitter layer 730 and N type drift region 714 and between emitter layer 730 and conduction channels 728 may be locally tailored. For example, those metal/semiconductor interfaces may be locally tailored by doping or by dopant segregation, or by the addition of a dielectric interfacial layer (not shown in FIG. 7), in order to adjust the Schottky barrier.

It is further noted that, as is the case for the representation of power transistor 600 by FIG. 6, although the implementation shown in FIG. 7 depicts power transistor 700 as having P type collector 710, optional N type buffer layer 712, N type drift region 714, and as being configured to provide N type conduction channels 728, that representation is merely exemplary. In other implementations, the described polarities can be reversed such that power transistor 700 may have an N type collector, an optional P type buffer layer, a P type drift region, and may be configured to provide a P type conduction channel. It is further noted that although power transistor 700 is shown to have a vertical structure, in other implementations, the present inventive principles can be readily adapted for use in a lateral device.

The operation of power transistor 700 is analogous to that of power transistor 600, in FIG. 6. When the voltage applied to insulated gates 720 is lower than the threshold voltage of power transistor 700, power transistor 700 is off. In that off state, the junctions formed by the interface of emitter layer 730 with N type drift region 714 and conduction channels 728 are blocking. When the voltage applied to insulated gates 720 reaches the threshold voltage of power transistor 700, electrons are injected through the junctions formed by the interface of emitter layer 730 with conduction channels 728, which are reverse biased. Such injection of electrons may occur due to thermionic emission, field emission (tunneling), and thermionic-field emission.

Thus, according to the exemplary implementation shown in FIG. 7, the parasitic bipolar transistor structure present in some conventional power transistors is eliminated. Consequently, and in contrast to such conventional power devices, power transistor 700 is advantageously configured to be latch-up free.

Figure 8:
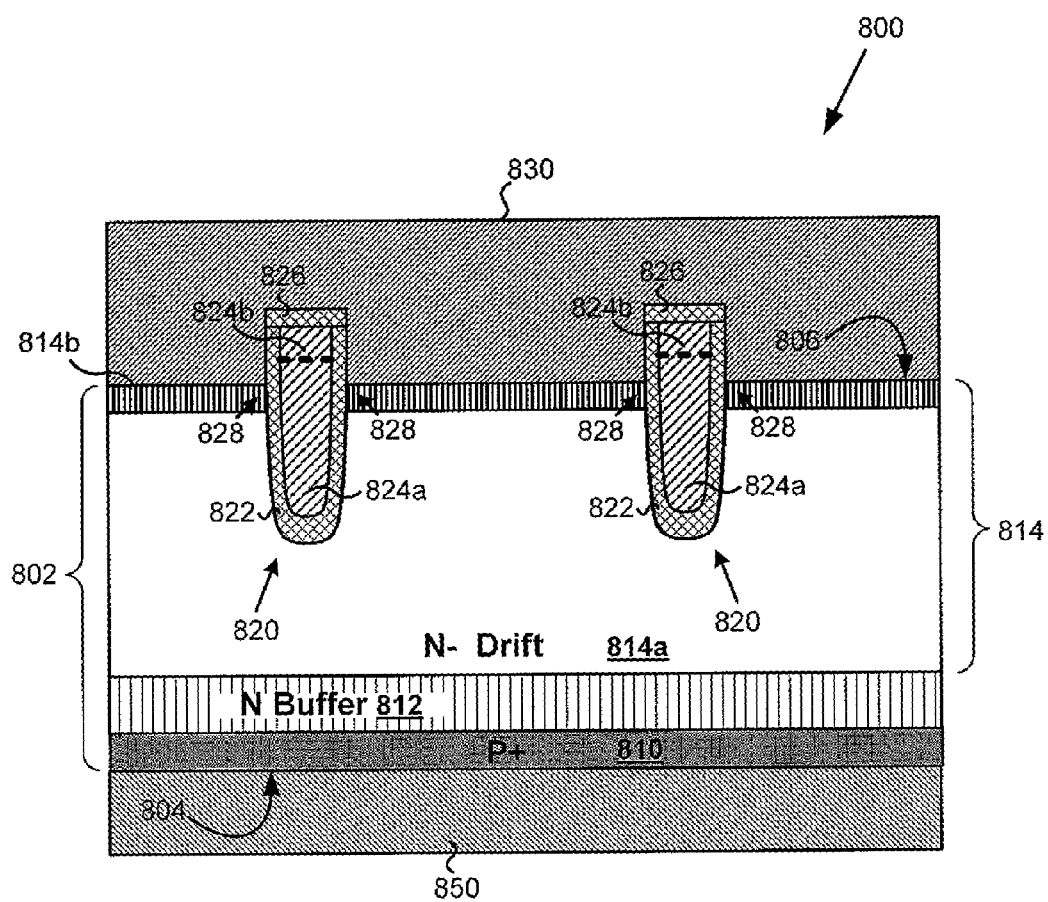
FIG. 8 presents a cross-sectional view showing a portion of an exemplary latch-up free power transistor, according to yet another implementation.

Continuing to FIG. 8, FIG. 8 presents a cross-sectional view showing a portion of exemplary latch-up free power transistor 800 in semiconductor substrate 802, according to yet another implementation. As shown in FIG. 8, power transistor 800 includes P type collector 810 at bottom surface 804 of semiconductor substrate 802, and N type drift region 814 situated over P type collector 810. As further shown in FIG. 8, power transistor 800 also includes insulated gates 820 in the form of insulated gate trenches extending from surface 806 of semiconductor substrate 802 into N type drift region 814. Each of insulated gates 820 includes a respective gate insulator 822 and conductive gate electrode portions 824a and 824b.

Power transistor 800 further includes emitter layer 830 formed of a metal, and conduction channels 828 controlled by insulated gates 820. Conduction channels 828 provide a conductive path in regions immediately adjacent insulated gates 820. Thus, when power transistor 800 is turned on, conduction channels 828 electrically couple metal emitter layer 830 to P type collector 810 via N type drift region 814. According to the implementation shown in FIG. 8, conduction channels 828 are N type channels.

Also shown in FIG. 8 is collector electrode 850 adjoining P type collector 810 and consequently also in electrical contact with conduction channels 828. In addition, power transistor 800 includes optional N type buffer or field stop layer 812, N type bottom drift region semiconductor material 814a and N type top drift region semiconductor material 814b of N type drift region 814, and dielectric layers 826.

Power transistor 800 corresponds in general to power transistor 600, in FIG. 6. That is to say, collector electrode 850, P type collector 810, and optional N type buffer layer 812, in FIG. 8, correspond respectively in general to collector electrode 650, P type collector 610, and optional N type buffer layer 612, in FIG. 6, and may share any of the characteristics attributed to those corresponding features, above. Moreover, N type bottom drift region semiconductor material 814a, insulated gates 820, dielectric layers 826, and conduction channels 828, in FIG. 8, correspond respectively in general to N type drift region 614, insulated gates 620, dielectric layers 626, and conduction channels 628, in FIG. 6, and may share any of the characteristics attributed to those corresponding features, above.

It is noted that although not explicitly shown in FIG. 8, power transistor 800 shares certain features in common with power transistor 100 and shown in FIG. 1B. Specifically, power transistor 800 further includes a semiconductor substrate top surface corresponding to top surface 108, in FIG. 1B, but not visible from the perspective shown in FIG. 8. Furthermore, and analogously to the description provided by reference to FIG. 1B, emitter layer 830 extends into a recessed portion of semiconductor substrate 802 relative to the top surface corresponding to top surface 108. Consequently, surface 806 at which emitter layer 830 make direct physical contact with semiconductor substrate 802 is situated at a level below the top surface of semiconductor substrate 802.

As further shown in FIG. 8, in addition to N type bottom drift region semiconductor material 814a, N type drift region 814 also includes N type top drift region semiconductor material 814b formed over and adjoining N type bottom drift region semiconductor material 814a. N type top drift region semiconductor material 814b may be formed as a germanium containing layer of semiconductor substrate 802, such as a Ge, SiGe, or SiGeSn layer, for example. It is noted that N type bottom drift region semiconductor material 814a and N type top drift region semiconductor material 814b adjoin insulated gates 820.

As noted above, insulated gates 820 are situated adjacent conduction channels 828 in power transistor 800. Moreover, conduction channels 828 are in direct physical contact with emitter layer 830 at surface 806 of semiconductor substrate 802 and with collector electrode 850 at bottom surface 804 of semiconductor substrate 802. As further shown in FIG. 8, emitter layer 830 is also in direct physical contact with N type top drift region semiconductor material 814b of N type drift region 814 adjacent conduction channels 828, at surface 806 of semiconductor substrate 802.

Thus, according to the present implementation, emitter layer 830 adjoins and makes direct physical contact with N type top drift region semiconductor material 814b of N type drift region 814, and also makes direct physical contact with N type conduction channels 828. Emitter layer 830 may be formed of any metal or metal stack forming a desirable contact with N type top drift region semiconductor material 814b and N type conduction channels 828.

The metal/semiconductor interface between emitter layer 830 and N type top drift region semiconductor material 814b may be locally tailored, for example, by doping or by dopant segregation, or by the addition of a dielectric interfacial layer (not shown in FIG. 8), in order to adjust the Schottky barrier. In addition, it is noted that in some implementations, N type top drift region semiconductor material 814b can be structured. For example, N type top drift region semiconductor material 814b can be structured so as to be situated only in conduction channels 828. In those latter implementations, the respective metal/semiconductor interfaces between emitter layer 830 and N type bottom drift region semiconductor material 814a and between emitter layer 830 and N type top drift region semiconductor material 814b and conduction channels 828 may be locally tailored as described above.

It is noted that, although not explicitly shown in FIG. 8, in some implementations, power transistor 800 may also include emitter electrodes corresponding to emitter electrodes 640, in FIG. 6, and sharing any of the characteristics attributed to those corresponding features, above. In such implementations, conduction channels 828 are in direct physical contact with those emitter electrodes at surface 806 of semiconductor substrate 802 and with collector electrode 850 at bottom surface 804 of semiconductor substrate 802. Moreover, in those implementations, emitter layer 830 is in direct physical contact with N type top drift region semiconductor material 814b of N type drift region 814 at surface 806 of semiconductor substrate 802, adjacent conduction channels 828. Thus, according to those implementations, emitter layer 830 adjoins and makes direct physical contact with N type top drift region semiconductor material 814b of N type drift region 814, while the emitter electrodes (not shown in FIG. 8) would be in direct physical contact with conduction channels 828.

It is further noted that although the implementation shown in FIG. 8 depicts power transistor 800 as having P type collector 810, optional N type buffer layer 812, N type drift region 814, and as being configured to provide N type conduction channels 828, that representation is merely exemplary. In other implementations, the described polarities can be reversed such that power transistor 800 may have an N type collector, an optional P type buffer layer, a P type drift region, and may be configured to provide a P type conduction channel. It is further noted that although power transistor 800 is shown to have a vertical structure, in other implementations, the present inventive principles can be readily adapted for use in a lateral device.

The operation of power transistor 800 is analogous to that of power transistor 600, in FIG. 6. When the voltage applied to insulated gates 820 is lower than the threshold voltage of power transistor 800, power transistor 800 is off. In that off state, the junctions formed by the interface of emitter layer 830 with N type top drift region semiconductor material 814b of N type drift region 814 and conduction channels 828 are blocking. When the voltage applied to insulated gates 820 reaches the threshold voltage of power transistor 800, electrons are injected through the junctions formed by the interface of emitter layer 830 with conduction channels 828, which are reverse biased. Such injection of electrons may occur due to thermionic emission, field emission (tunneling), and thermionic-field emission.

Thus, according to the exemplary implementation shown in FIG. 8, the parasitic bipolar transistor structure present in some conventional power transistors is eliminated. Consequently, and in contrast to such conventional power devices, power transistor 800 is advantageously configured to be latch-up free.

Thus, the present application discloses implementations of a latch-up free power transistor. According to the exemplary implementations disclosed in the present application, a highly doped region utilized as a source or emitter diffusion in a conventional power transistor structure is omitted. In its place is substituted an emitter electrode or a portion of an emitter layer configured to make direct physical contact with a conduction channel of the power transistor. Consequently, the power transistor structures disclosed herein eliminate the parasitic bipolar junction transistors present in conventional IGBT structures, thereby advantageously preventing the occurrence of latch-up.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A power transistor, comprising:
    a semiconductor substrate having a bottom surface and a top surface;
    a body region of a first conductivity type disposed in said semiconductor substrate and extending to said top surface of said semiconductor substrate;
    a drift region of a second conductivity type opposite said first conductivity type and disposed in said semiconductor substrate below said body region;

a collector region of said first conductivity type disposed in said semiconductor substrate below said drift region and extending to said bottom surface of said semiconductor substrate;

an insulated gate extending into said drift region and situated adjacent to a conduction channel in said body region; and a metal emitter above said semiconductor substrate and in direct physical contact with said top surface of said semiconductor substrate, wherein a first portion of the body region that is directly adjacent to the insulated gate extends to the top surface, and wherein the conduction channel is disposed in the first portion of the body region, and wherein the metal emitter directly contacts the conduction channel at the first portion of the body region.

2. The power transistor of claim 1, wherein said conduction channel is an N type channel.

3. The power transistor of claim 1, wherein said conduction channel is a P type channel.

4. The power transistor of claim 1, further comprising a metal emitter electrode in direct physical contact with said body region and with said metal emitter.

5. The power transistor of claim 4, wherein said metal emitter electrode comprises a rare earth metal.

6. The power transistor of claim 4, wherein said metal emitter electrode comprises erbium silicide.

7. The power transistor of claim 4, further comprising a body contact region of said first conductivity disposed in said body region adjacent said conduction channel, wherein said body contact region has a greater doping concentration than said body region and separates said body region from said metal emitter.

8. The power transistor of claim 7, wherein said metal emitter makes direct Schottky and/or ohmic contact with said body contact region, and wherein said metal emitter electrode makes direct Schottky and/or ohmic contact with said body region at said conduction channel.

9. The power transistor of claim 4, wherein said semiconductor substrate includes a recessed portion, wherein said metal emitter electrode is situated in said recessed portion, and wherein said metal emitter extends into said recessed portion.

10. The power transistor of claim 4, further comprising a dielectric layer separating said metal emitter from a top surface of a conductive gate electrode of said insulated gate and from a top surface of said metal emitter electrode.

11. The power transistor of claim 4, wherein a top surface of said metal emitter electrode is in direct physical contact with said metal emitter.

12. The power transistor of claim 4, wherein said metal emitter electrode has a width which spans a width of said conduction channel so as to separate said conduction channel from said metal emitter.

13. The power transistor of claim 12, wherein said width of said metal emitter electrode is an integer multiple of said width of said conduction channel.

14. The power transistor of claim 12, wherein said width of said metal emitter electrode ranges between 10 nm and 30 nm.

15. The power transistor of claim 1, further comprising a metal collector in direct physical contact with said bottom surface of said semiconductor substrate.

16. The power transistor of claim 1, further comprising a body contact region of said first conductivity disposed in said body region adjacent said conduction channel, and wherein said body contact region has a greater doping concentration than said body region and separates said body region from said metal emitter.

17. The power transistor of claim 1, wherein said metal emitter electrode comprises erbium.

18. The power transistor of claim 1, wherein said insulated gate extends beyond said top surface of said substrate and into said metal emitter.

* * * * *